United States Patent [19]

MacIntyre et al.

[11] Patent Number: 4,931,738

[45] Date of Patent: Jun. 5, 1990

[54] BATTERY MONITORING SYSTEM OF CELL GROUPS AND DISPLAY

[75] Inventors: Hazen L. MacIntyre, Woodland Hills; Richard D. Graham, II, Acton; Michael B. Aldava, Tehachapi, all of Calif.

[73] Assignee: Kaufel Group, Ltd., Dorval, Canada

[21] Appl. No.: 303,452

[22] Filed: Jan. 27, 1989

[51] Int. Cl.$^5$ ............................................. G01N 27/46
[52] U.S. Cl. ..................................... 324/435; 324/434; 324/433; 340/636
[58] Field of Search ............... 324/426, 429, 433, 434, 324/435; 340/636, 660; 320/48

[56] References Cited

U.S. PATENT DOCUMENTS

| | | | |
|---|---|---|---|
| 4,423,378 | 12/1983 | Marino et al. | 324/433 |
| 4,442,424 | 4/1984 | Shirasaki et al. | 340/715 |
| 4,484,140 | 11/1984 | Dieu | 324/434 |
| 4,609,914 | 9/1986 | Fathi | 324/435 |
| 4,633,418 | 12/1986 | Bishop | 324/434 |
| 4,823,086 | 4/1989 | Whitmire et al. | 324/434 |

OTHER PUBLICATIONS

Dualite, Spectron Emergency AC Systems, 7/86, 20 page brochure.

Primary Examiner—Reinhard J. Eisenzopf
Assistant Examiner—Jack B. Harvey

[57] ABSTRACT

A battery monitoring system has an LED matrix displaying plural battery group conditions. The matrix has a column defining reference row of LED indicators, each active LED representing an adjacent voltage range. The reference row is responsive to an average battery voltage of plural battery groups. Aligned in columns with the reference row LED's are plural LED rows, each row representing an individual battery group. An active LED indicates an individual battery group voltage of the corresponding individual battery group. Analog multiplexing of scanned battery group voltages are sequentially applied to the matrix rows at a scan rate greater than the visual persistence of the LED's so that at any given moment, an LED appears active in each row as well as in the reference row. To focus on a single battery group, a scan switch interrupts application of scanned battery voltages. A digital display also selectively indicates either overall plural battery groups voltage or individual battery group voltage.

19 Claims, 3 Drawing Sheets

BATTERY MONITORING SYSTEM OF CELL GROUPS AND DISPLAY

FIELD OF THE INVENTION

This invention relates to systems for continuously monitoring the state of battery systems. In particular, the invention pertains to the monitoring of aspects of the state of cell groups for batteries used for emergency lighting and other systems' batteries requiring a state of readiness over extended time periods.

BACKGROUND OF THE INVENTION

In a variety of applications, storage cells arranged in batteries are used to power various types of equipment, such as emergency lighting and battery powered vehicles.

Typically, present monitoring and warning systems report on battery system failure or inadequacy as a whole, rather than indicating the specific cells or cell groups at fault. Such systems rarely provide advanced warning of a possible failure and are generally incapable of indicating trends in the quality of the battery system. This inability to provide early warning of impending failure can result in unnecessary destruction of the entire battery system, resulting in costly failure and possibly unfortunate safety consequences.

Thus it would be desirable to provide battery monitoring apparatus capable of early detection of impending battery cell group failure.

SUMMARY OF INVENTION

Battery monitoring apparatus in accordance with this invention generally comprises one or more batteries having a plurality of cells or cell groups, means for sampling the battery voltage of one or more cells or cell groups of the battery and means for reporting as to the battery conditions of one or more cells individually. Means for integrating the conditions of a plurality of cell groups, each group containing one or more cells is provided for assessing the overall condition of the battery.

Additional features in accordance with the invention includes means for displaying an indication reflecting the overall voltage condition of the batteries, means for switching the battery scan rate, and interrupting the scan specifically to monitor individual selected battery rows. Thus, the system provides for identifying individual or combinations of cell groups that may be over or undercharged, exhibiting a variety of symptoms such as shorted cells, sulfation or loose battery connections. Means are provided for automatically resuming scanning of cell groups after a preset interval following manual operation inspecting the condition of cell groups.

BRIEF DESCRIPTION OF THE DRAWINGS

The nature of the invention described herein may be best understood and appreciated by the following description taken in connection with the accompanying drawings in which:

FIG. 4 is a diagram showing a portion of the display panel condition of equal battery cell group voltage, in accordance with this invention;

FIG. 5 is a diagram showing a portion of the display panel of FIG. 2 whereby one of the battery cell groups is of unequal voltage, in accordance with this invention.

DETAILED DESCRIPTION

Figure 1:
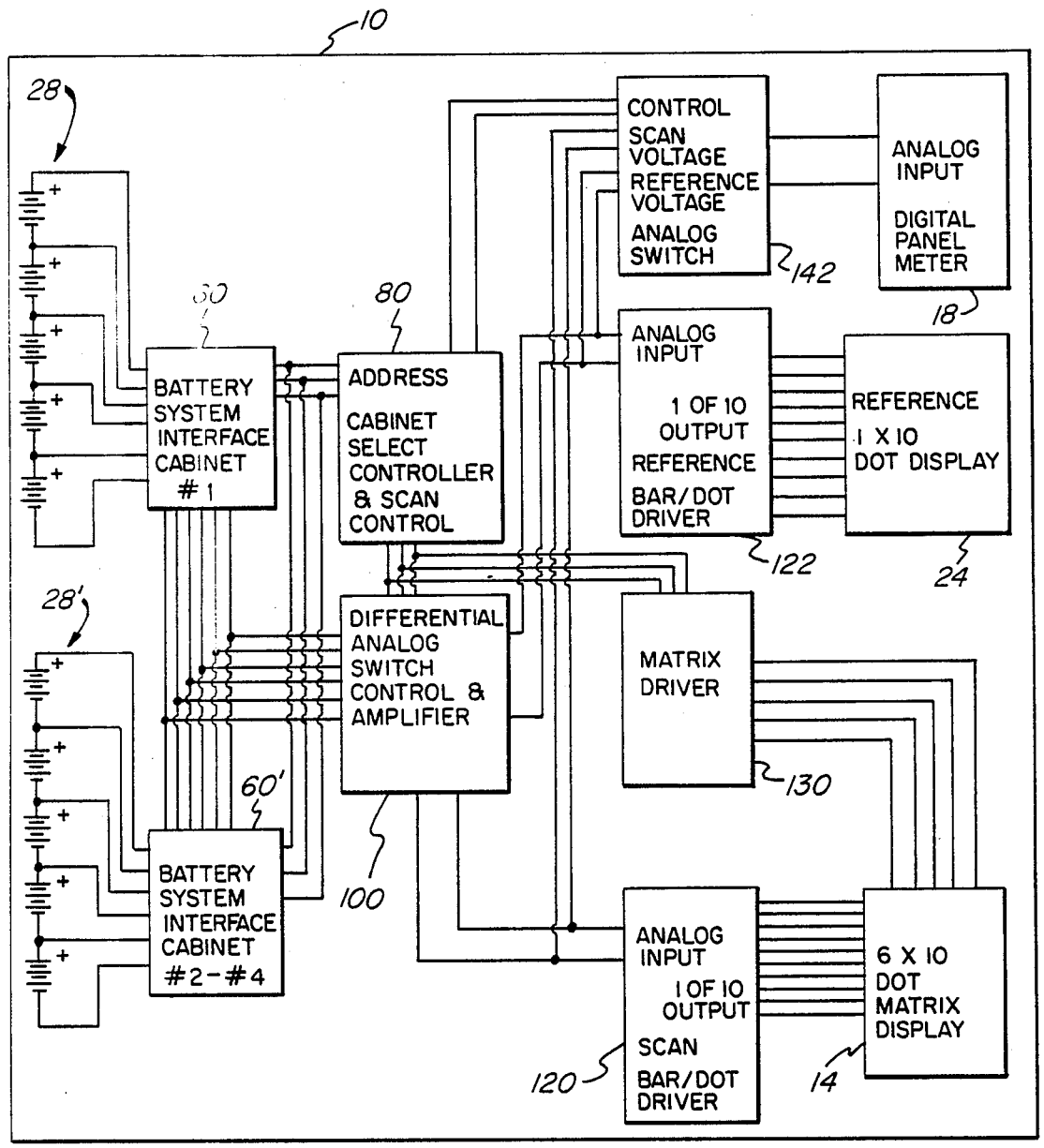
FIG. 1 is a schematic block diagram of the overall system of the invention.

With particular reference to FIGS. 1, 2, 3 and 6, a battery monitoring system 10 in accordance with this invention generally comprises a display panel 12 having an array of indicator lamps 14 arranged in a matrix, each row of which representing separate battery cell groups or battery A"shelves" 16. LED's are preferably used, though it should be recognized that liquid crystal displays and other visual displays are meant to be included with reference to the terminology of the indicator lamps 14. A digital readout indicator 18 responsive to the selected one of indicator lamps 14 is provided for displaying the voltage of an individual cell or cell groups. By cell group, it is meant to mean any one or more cells or groups of batteries to be tested at a given time. In this particular example, a cell group is a row of batteries 17 on a shelf 16 of a cabinet 15.

To best understand the manner in which the system operates, an example of a battery system is provided of the type which may be used for supplying power for emergency lighting systems, though it should be recognized that the battery monitoring system may be used in other environments where battery system monitoring is beneficial.

Assume that the system is a 4000 vA system in which a battery voltage of 72 volts is required. Those batteries are supplied in the form of two batteries per "shelf" 16. In this example, a cell group would be a "shelf" of batteries.

Each cabinet 15 typically can have up to 5 shelves of batteries. Each shelf 16 of batteries is represented on a display panel by a row of LED's. In addition, a reference row of LED's appears at the top in alignment with the rows. Thus in this example, 5 rows of LED's beneath the reference LED are shown, each row representing a shelf. On each shelf are two batteries. In a system up to 4000 volt amperes, a 72 volt system would normally be used, which would have only 3 shelves. Above 4000 vA, a 120 volt DC system would be used, which would be typically a 5 shelf system. A system may have more than one cabinet which can be separately and sequentially monitored by the system. Here, for example, the monitoring of cabinet "A" lasts for 4 seconds after which the indicator monitors the next cabinet in sequence.

Figure 2:
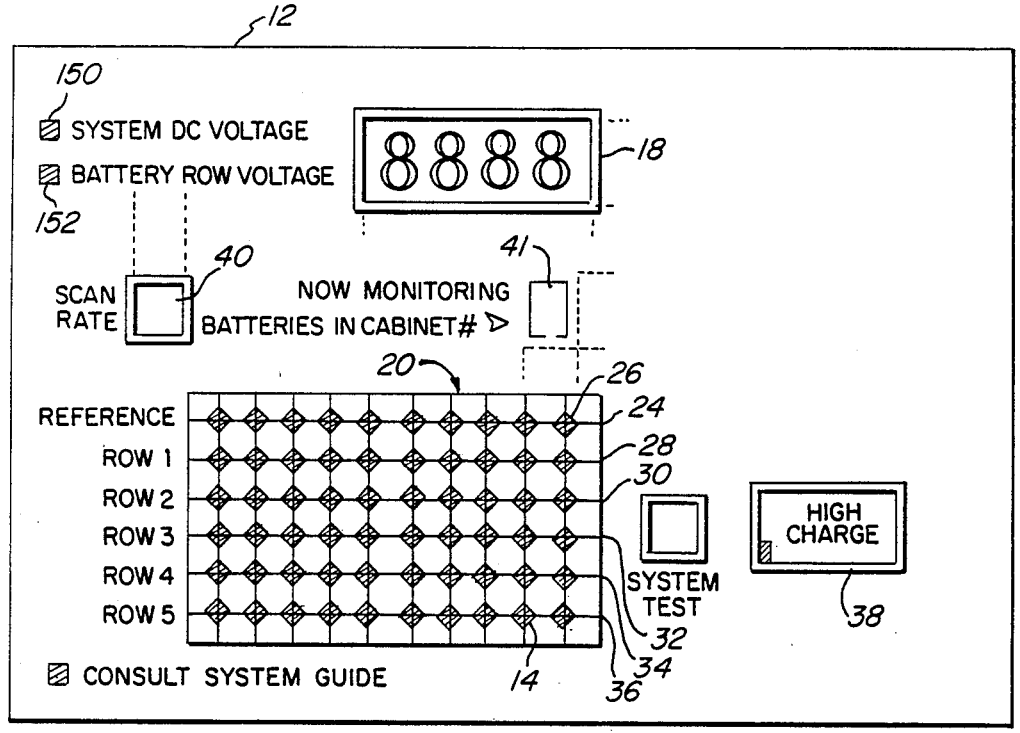
FIG. 2 is an elevational view of a display panel of the system depicted in FIG. 1.
Figure 6:
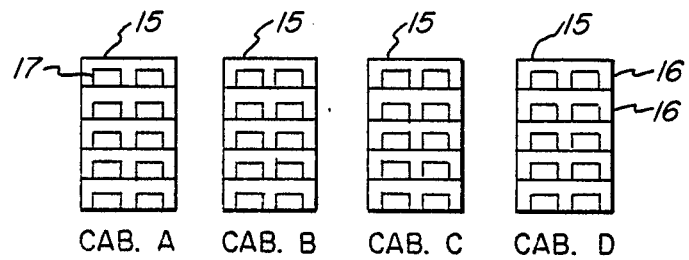
FIG. 6 is a diagram showing an arrangement of batteries disposed in cabinets for monitoring in accordance with this invention.
Figure 3:
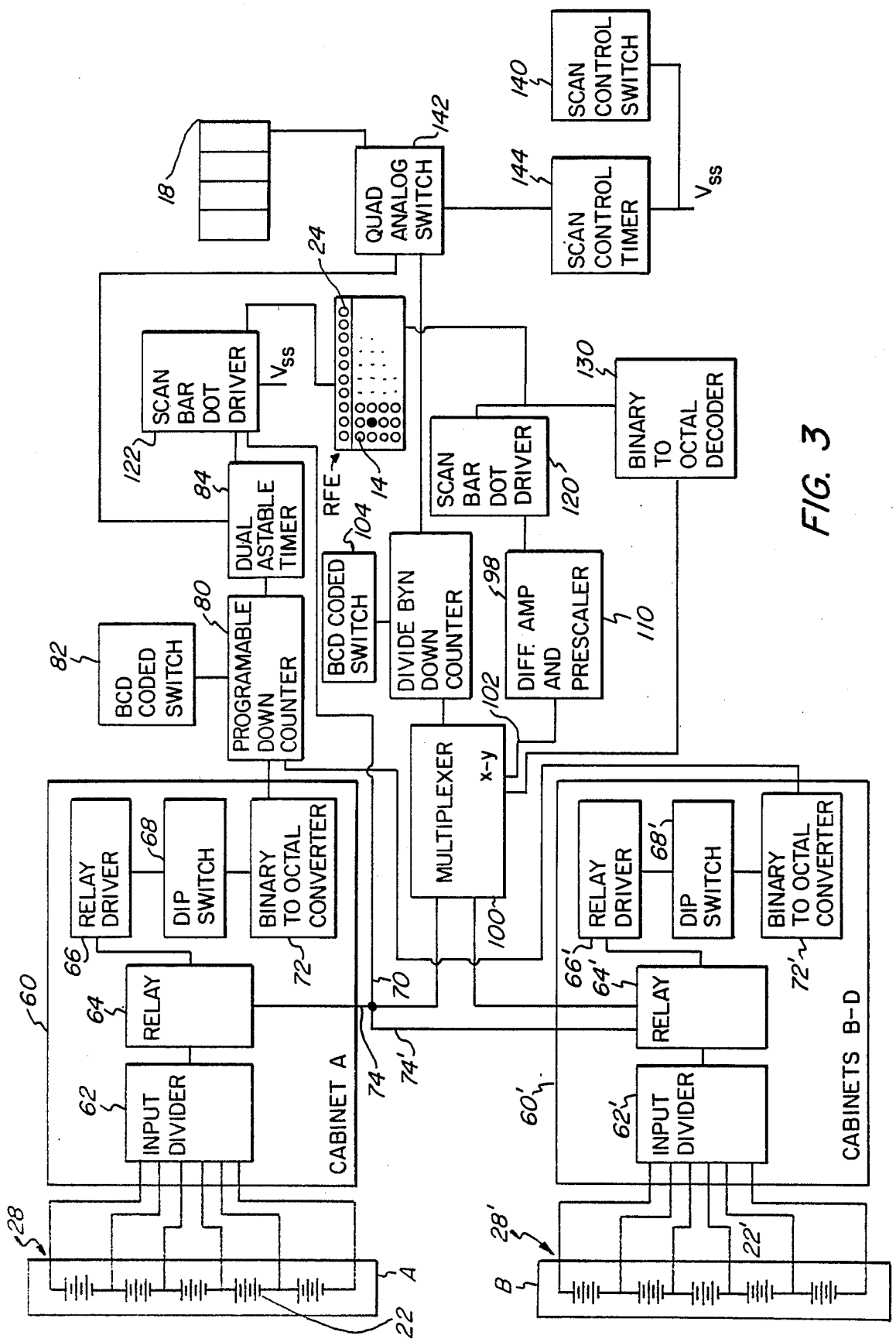
FIG. 3 is a more detailed block diagram of the system depicted in FIG. 1.

With particular reference to FIG. 2, the display panel 12 for the system is shown which comprises an array 20 for displaying relative conditions of battery shelve 16. The array 20 comprises a reference row 24 of a plurality of LED's, 26 here showing 10 LED's. The reference row 24 represents a visual indication of the composite average voltage of the group of battery shelves being measured at any given time, thus providing an average indication of the overall voltage of a battery cabinet 15. The particular one of lamp 26 illuminated represents a particular average voltage. The reference LED illuminated in the reference row 24 displays an indication representing the overall average voltage of the 5 shelves as compared to a reference voltage.

For example, 5 rows of batteries at 24 volts each would result in a total voltage of 120 volts. This divided by 5 rows equals 24 volts, which would be the reference voltage a lamp corresponding to 24 volts would appear illuminated in the top or reference row of the display. Beneath the reference row 24 are a plurality of rows 28, 30, 32, 34, 36 here labeled rows 1-5 of lamps 14. Each lamp 14 in row 1 to 5 represents a voltage established for the system and when illuminated corresponds to the voltage of a particular battery shelf in the system. Thus, each of rows 28, 30, 32, 34, 36 represents a battery shelf or group of batteries being monitored. The LED 26 illuminated in reference row 24 represents the average voltage of the rows beneath which are illuminated.

Ten columns of LED's are present. Column 8 represents an indication that the unit is fully charged. If the system is properly charging, all LED's in the 8th column will remain lit. If column 9 or 10 is active or lit, one or more of the batteries are in an overcharged state. An alarm 38 is typically coupled to be actuated if the voltage causes illumination of the LED in the 10th column. Typically, the columns are set for 2.4 volt increments for each lamp.

A scan rate switch 40 provides for disabling the automatic scanning system and for monitoring individual groups of batteries or individual shelves. A digital readout 41 provides an indication of which cabinet 15 is being monitored at a given time With particular reference to FIG. 3, interface circuits 60, 60', are each coupled to a battery cabinet 28, 28'. Symbolically, interface cabinets #B through D are shown schematically in FIG. 6, it being understood that the number of interfaces corresponds to the number of battery cabinets which are used and thus being monitored by the display for a given system.

The interface circuits 60, 60' comprise input divider and filter circuits 62, 62' each coupled to corresponding battery cabinets 28, 28'. Normally open relay circuits 64, 64' or analog switches are coupled to and are responsive to the input divider and filter circuits 62, 62' to selectively to deliver a signal corresponding to the voltages of the battery shelves 16. The relay circuits 64, 64' are coupled to and are responsive to relay driver circuits 66, 66' which selectively close the relay during the scan process to correspond to the particular battery sets (or battery shelves in the cabinet) 22, 22' which are being monitored.

A programming switch, represented by the dip switches 68, 68' are coupled to the relay driver circuits 66, 66' to cause the relay circuits 64, 64' to send specific voltage signals corresponding to particular battery shelf voltage indications to a signal bus 70.

Thus, the interface circuits 60 respond to BCD data according to the setting of the programmable switches 68. When the decoded BCD data matches the corresponding setting of the program switches 68, the interface relay circuits 64 transfers the filtered and divided voltages of that particular battery set to the signal bus 70.

The interface circuits 60, 60' are coupled to the signal bus 70 which ultimately delivers the signals representing voltage indications of cell groups depending upon the particular time frame of the scanning cycle. The signal bus 70 typically will have a plurality of conductors 74, 74', each of which conductor corresponds to a single voltage indication for a battery shelf 16. The signal bus 70 represented here is an analog bus which signal is later converted into a digital signal displayed upon the readout panel 18.

A programmable down counter 80 wired as a frequency divider is coupled to the relay circuits 66, 66' via the octal decoders 72, 72'. It supplies BCD data for calling up battery terminal sample points to the signal bus 70. The typical sampling rate for a selected battery set is approximately 4 seconds. Thus, every 4 seconds, all cell groups of a particular cabinet have been sampled. BCD coded switch 82 is coupled to the programmable down counters 80 to call up terminal sample points to the signal bus 70.

Coupled to the programmable down counter 80 is a timer 84 such as an LM556 wired as a dual astable oscillator. The function of the timer 84 is to supply clock pulses to the inputs 86 of down counter 80 and down counter 98. One output 92 is approximately set at 4 second intervals (0.25 Hz) while an output 94 is approximately set at 0.0025 seconds (400 Hz).

A differential analog multiplexing switch 100 is coupled to the output 96 of a down counter 98 for receiving its BCD data as coded by BCD switch 104. The multiplexing switch 100 decodes the BCD data from the divide by N down counter 98 and connects X and Y inputs and supplies X and Y channel outputs 102. By way of this example, the X and Y channel inputs provide the following X and Y channel outputs according to the following table:

TABLE I

| BCD Code | Voltages on Signal Buss | | | | | | Diff. Volt. X-Y | Active Row |
|---|---|---|---|---|---|---|---|---|
| | +12 | +9.6 | +7.2 | +4.8 | +2.4 | 0 | | |
| 101 | X | Y | | | | | 2.4 V | 1 |
| 001 | | X | Y | | | | 2.4 V | 2 |
| 110 | | | X | Y | | | 2.4 V | 3 |
| 010 | | | | X | Y | | 2.4 V | 4 |
| 100 | | | | | X | Y | 2.4 V | 5 |
| 000 | | | | | | | | Reset to 101 |

A higher voltage variation at any given X, Y input will result in a higher or lower differential voltage at the X, Y output.

For example, if X at address 010 is 3.8 volts and Y at address 010 is 2.4 volts, the differential voltage at the X, Y output is 3.8−2.4=1.4 volts differential.

The differential voltage at the X, Y output is fed into the + and − inputs of a differential amplifier and prescaler 110 which references the resulting output voltage to Vss. The prescaler 110 calibrates the resulting output voltage for input to the scan bar/dot driver 120.

The bar/dot driver 120 responds to the input from the amplifier/prescaler 110 by bringing one of the ten columns of LED's 14 to an active low status in synchronization with a BCD decoder 130 which brings one of the five rows to an active high status. This provides sufficient forward current to illuminate one of the fifty LEDs in the dot matrix.

Provided the BCD data that is being supplied to both the analog multiplexer 100 and the BCD decoder 130 is cycled substantially above the flicker perception of the eye, a single vertical line of LED's will appear to be illuminated simultaneously yet respond independently to its corresponding row input. Thus, with reference to FIG. 4, the lit row indicates test batteries are equal with respect to a terminal voltage, but with reference to FIG. 5, an indication is provided that the cell groups are equal except for row 2.

The bar/dot display driver 122 is wired and calibrated so as to provide a variable reference indicator which responds to the voltage level of th entire DC system voltage. Its purpose is to provide a visible reference point with which to evaluate the scanned individual battery voltages.

Thus, by way of example, if the column 8 LED in the reference row 24 is illuminated, column 8 of rows 1 through 5 should be illuminated. If one or more rows differ from this, a potential problem may be recognized. The number of shifted positions of an indicator would indicate the severity of the problem.

A 3½ digit panel meter 18 has its input controlled via the scan control 140. Normally this meter 18 indicates the entire system DC voltage.

A quad analog switch 142 such as an MC 14066 and an IC timer 144 such as an LM555 provide a time delay, typically set for a 30 second period, to enable individual display of a row of batteries on a shelf. Normally, the LM555 timer output is low. The output is inverted to a high state, turning on two of the four analog switches in the quad analog switch 142 such as an MC14066. Input-/output #1 converts the DPM(+) input to the divided value of the entire system battery voltage. Input/output #3 counts the 400 hz clock pulses from the 556 timer 84 to the programmable down counter 98.

When the scan control 140 is activated, the timer 144 output goes to a high state and the 30 second time period begins. Input/output 1 & 3 of analog switch 142 are turned off and input/output of 2 and 4 are turned on. The astable operation of the timer 84 is inhibited. The Vss reference voltage of the differential amplifier 110 is directed to the (+) input of the DPM 18 via in/out #2 of the analog switch 142 which allows the DPM 18 to display accurately the reading of the corresponding individual batteries being monitored.

The control of the scanning sequence is configured such that each additional actuation of the scan control button 40 and the scan control 140 supplies one clock pulse to the BCD down counter 80 thereby manually controlling the scanning process. Additionally, each actuation of the scan control switch 140 resets the 30 second delay of the timer 144. In this configuration the QO output of the BCD counter 98 is connected to the clock input of the counter via the MC14066 in/out #4 of the quad analog switch 142. This causes one clock pulse at the clock input of the counter 98 for each complete scan of a given battery set allowing the scan process to proceed sequentially from cabinet to cabinet under manual control. If the scan control 140 is not actuated for 30 seconds the output of the 555 timer 144 will return to a low state which reinstates the high speed automatic sampling process of the system.

A digital readout 18 coupled to the quad analog switch 142 is provided for monitoring voltages, and depending on the setting of the system, either the voltage of the entire overall battery system, or a particular battery or cell group. Adjacent to the digital readout 18 are a leds 150 and 152 for indicating whether the digital readout is displaying a system DC voltage or a battery row voltage.

In operation, the plural interface circuits 60, 60' sequentially couple the differential analog multiplexer to separate plural groups of batteries 22, 22', whereby separate battery groups can be scanned at sequential time intervals. Thus, for four seconds, the voltages of batteries 22 of cabinet A are applied to the multiplexer 100, and then during the next four seconds, batteries 22' of cabinet B are applied to the multiplexer 100, followed by four seconds for cabinet C and four seconds for cabinet D. The cabinet being monitored is indicated by the readout 41 on the display panel.

During the first interval, the voltage potential across each of the cell groups of the batteries 22 in the first cabinet is applied to the input divider 62. A differential reference voltage is used so that it is only necessary to apply the voltages as set forth in Table I. The voltages representations are decoded and applied by the bar dot driver 122 to the matrix 20 so that each row 28, 30, 32, 34, 36 of the matrix 20 beneath and aligned with the reference row 24 represents an individual battery group within cabinet A, and the reference row 24 represents the average voltage of the battery group. The lamp lit in the reference row 24 determines the average voltage, within a limited range, of the battery groups in cabinet A, and then successively in cabinets B, C and D during the subsequent sampling sequence. The lamp lit in the succeeding rows beneath the reference row represents the voltage, within a limited range, of individual battery groups in cabinet A. In the event that a overcharge condition exists, a high charge indicator is activated.

Upon pressing the scan control switch 40, the voltage of a particular battery group within cabinet A, represented by the voltage in one of the rows 28, 30, 32, 34, 36, can be individually examined, as the voltage will appear in the digital display 18. After examining a single battery group, a time delay permits the digital display to return to displaying the average voltage of the plural battery groups of cabinet A.

A system DC voltage lamp 150 provides an indication on the panel 12 that the average battery voltage is appearing on the digital readout. A battery row voltage lamp 152 provides an indication on the panel 12 that the scanning has been halted and that the voltage appearing on the digital readout 18 is that of a single battery group.

Though battery and battery group and shelves of batteries have been referred to in specific examples, it should be recognized that apparatus in accordance with this invention may be used to monitor battery cells and cell groups to the extent that voltage potential indications attached to individual cells or cell groups can be provided. The term cell group is intended to include and be the equivalent of the terms "battery" and battery shelf.

While the invention has been described with reference to specific forms thereof, it will be understood that changes and modifications may be made within the spirit and scope of this invention.

What is claimed is:

1. Battery monitoring apparatus for observing the charge condition of a plurality of battery cell groups, each cell group comprising at least one cell, comprising:
a display panel having a multiplicity of visual display means for providing a separate quantitative indication of the charge condition of each one of the plurality of cell groups being monitored and of the plurality of cell groups collectively;
means for driving the visual display means in response to a measured voltage potential related to the condition of each cell group to cause the visual display means to exhibit separate quantitative visual displays corresponding to the measured voltage potential of each cell group; and means for coupling the driving means to plural cell groups;

whereby the quantitative charge condition of a single cell group and of a plurality of cell groups may be individually determined by observation of said display panel to provide for diagnosis of cell group conditions for purposes of monitoring and replacement.

2. The invention as set forth in claim 1 wherein said apparatus includes digital readout means in synchronization with said visual display means to provide a visual digital indication responsive to the charge condition visual display means of the separate cell groups.

3. The invention as set forth in claim 2 and including:

means for sequentially scanning the electrical condition of plural cell groups;

means for interrupting a scanned display of plural cell groups for inspection of the electrical condition of a single cell group and for substantially simultaneously separately displaying the condition of the cells of plural cell groups upon such interruption; and means for converting the indication relating to the single cell group being inspected from a collective indication to individual indications and causing the driver means to cause the visual display means to display an indication of the charge condition of the cells of a single cell group.

4. The invention as set forth in claim 3 and including means for providing an indication signal composite voltage condition of the plural cell groups sampled; and means for displaying the composite signal.

5. The invention as set forth in claim 1 and including digital display means for reading composite voltage conditions of plural cell groups; and wherein each of said visual display means comprise a plurality of adjacent indicators, each set of indicators being responsive to the voltage indication of a single cell group, each set having plural indicators, each of said indicators of a set being responsive to said driving means to represent a given voltage range of a cell group whereby only one indicator of each set responsive to the measured voltage is displayed in an "on" condition at any one time.

6. The invention as set forth in claim 5 and including multiplexing means for sampling voltages of plural cell groups and delivering a decoded signal representative of the voltage of each cell group at staggered time separated intervals to the indicator sets representative of the specific cell group sampled, the indicators of each indicator set having a period of visual persistence and the time intervals until the indicators of a given set are refreshed being less than the persistence of the indicators of each indicator set, whereby the indicators of the voltages of plural cell groups being scanned at substantially time discrete and spaced apart intervals sampling intervals, are simultaneously displayed individually by the indicator sets, visually in a continuously active state, the staggered sampling and application of signals to the separate indicator sets being substantially imperceptible to the observer.

7. Batter monitoring apparatus comprising:

an electrical battery arrangement comprising a plurality of cell groups, each cell group having at least a single electrical cell, each cell group having a measurable voltage;

means for remotely sampling the voltage of the cell groups individually;

means for automatically scanning the charge conditions of the cell groups and clusters thereof;

a display panel having a multiplicity of visual quantitative display means each having a multiplicity of visual indicators for separately visually displaying a selected one of plural quantitative indications in response to the voltage of a cell group sampled, the visual display means further including second similar visual quantative display means for providing a reference indication related to the overall charge condition of the electrical battery arrangement;

means for driving the multiplicity of visual display means and second display means, the driving means being responsive to the overall condition of the electrical battery arrangement and the condition of individual cell groups being sampled to effect apparent simultaneous display of the overall condition and the condition of the individual cell groups; and means coupling the driving means to plural cell groups;

whereby individual charge conditions of a plurality of cell groups may be compared to the overall condition of the battery arrangement for purposes of monitoring and replacement.

8. The apparatus as set forth in claim 7 and in which the plural quantitative indicators have a visual persistence, the apparatus also including means for scanning and displaying the charge condition of a multiplicity of cell groups at sufficiently rapid intervals to overcome the level of persistence of the indicators and thereby appear to simultaneously and individually display voltage levels of separate cell groups.

9. The apparatus as set forth in claim 8 and including means for manually interrupting the scanning of clusters of cell groups for individually monitoring and displaying the voltage condition of an individual cell group, whereby attention can be focussed on the condition of individual cell groups, and means for restoring the automatic scanning to display the overall condition of the battery arrangement.

10. The apparatus as set forth in claim 9 and in which the plural indicators comprise a set of plural visual indicators responsive to each cell group, each of said plural visual indicators providing a display uniquely identifying a particular voltage range whereby it can be visually determined whether the activated voltage range indication is above or below a nominal voltage, and wherein there is included means for displaying a composite reference indication responsive to plural cell group voltages.

11. A battery discharge monitoring system comprising:

an electrical battery arrangement comprising a plurality of cell groups, each cell group having at least a single electrical cell;

means for providing a reference voltage;

interface means for remotely sampling the voltage condition of individual cell groups with respect to the reference voltage;

a visual display panel having a multiplicity of visual display means each comprising plural indicators for quantitatively providing a visual display in response to the relationship of the voltages sensed, said plural indicators of said multiplicity of visual display means separately and substantially simultaneously indicating a condition of plural cell groups; and reference indication means for displaying a charge condition responsive to the overall condition of the electrical battery arrangement whereby the plural indicators responsive to the condition of the cell groups may be visually compared with the reference indication means to view and compare the condition of separate cell groups to the condition of the reference indication means;

whereby conditions of plurality of cell groups may be individually determined for purposes of monitoring, maintenance and replacement.

12. The system as set forth in claim 11 and in which the reference means comprises a reference row of said visual display means for illuminating and providing a visual indicator corresponding to an average voltage of a plurality of cell groups.

13. The system as set forth in claim 12 and in which the visual display comprises discrete visual indicators for a multiplicity of different charge ranges.

14. The system as set forth in claim 13 and in which said visual display panel includes a dot matrix of lamps providing said indicators, and further comprising a scan bar dot matrix driver coupled to said lamps.

15. The system as set forth in claim 14 and in which the system includes a programmable decoder coupled to a relay for providing relative voltages for each of the plural battery groups, and a programmable down counter coupled to the relay driver for selectively delivering an indication of the voltage level at time intervals.

16. The system as set forth in claim 15 and including:
a differential analog multiplexer coupled to a BCD input representative of separate cell groups during a particular time interval;
differential amplifier prescaler means for providing an average voltage indication signal to said reference row for providing a visual indication related to the average voltage condition of the plural cell groups; and
scan bar driver means responsive to the analog multiplexer, the scan bar driver being coupled to the lamp dot matrix for providing a visual display of individual cell groups.

17. The system as set forth in claim 16 and in which the lamp dot matrix comprises a plurality of rows, each row representing a different cell group, and in which the lamp being lit is representative of a voltage range for the cell group.

18. The system as set forth in claim 17 and in which the reference row comprises a plurality of lamps disposed in alignment with the lamp dot matrix, the reference row being responsive to the average voltage of the cell groups of the arrangement so as to illuminate a lamp representative of the average voltage range for the battery arrangement, whereby voltage ranges responsive to separate cell groups may be individually compared to the voltage range lamp of the reference row; and wherein said interface means has plural input circuits for sequentially coupling the differential analog multiplexer to separate plural groups of batteries, whereby separate battery groups can be scanned at sequential time intervals.

19. The system as set forth in claim 18 and including means for cycling the BCD data to the analog multiplexer and the BCD decoder above the flicker perception of the human eye, whereby indicators of multiple rows appear to be simultaneously illuminated.

* * * * *